(12) United States Patent
Zhang et al.

(10) Patent No.: US 11,380,712 B2
(45) Date of Patent: Jul. 5, 2022

(54) DISPLAY PANEL, MANUFACTURING METHOD THEREOF, AND DISPLAY APPARATUS

(71) Applicants: Chengdu BOE Optoelectronics Technology Co., Ltd., Sichuan (CN); BOE TECHNOLOGY GROUP CO., LTD., Beijing (CN)

(72) Inventors: Qin Zhang, Beijing (CN); Duanming Li, Beijing (CN); Guowei Li, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 241 days.

(21) Appl. No.: 16/763,371

(22) PCT Filed: Dec. 4, 2019

(86) PCT No.: PCT/CN2019/122978
§ 371 (c)(1),
(2) Date: May 12, 2020

(87) PCT Pub. No.: WO2020/258728
PCT Pub. Date: Dec. 30, 2020

(65) Prior Publication Data
US 2021/0408064 A1  Dec. 30, 2021

(30) Foreign Application Priority Data
Jun. 27, 2019  (CN) .......................... 201910570439.0

(51) Int. Cl.
*H01L 27/12* (2006.01)
*G06F 1/16* (2006.01)

(52) U.S. Cl.
CPC ........ *H01L 27/1218* (2013.01); *G06F 1/1686* (2013.01); *H01L 27/1262* (2013.01)

(58) Field of Classification Search
CPC .................................................. H01L 27/1218
(Continued)

(56) References Cited

U.S. PATENT DOCUMENTS 8,569,774 B2 * 10/2013 Yuasa ................. H01L 51/5209
313/503
2008/0251785 A1 * 10/2008 Noh ..................... H01L 27/1248
257/E29.147

(Continued)

FOREIGN PATENT DOCUMENTS

CN  107452894 A  12/2017
CN  107579171 A  1/2018
(Continued)

OTHER PUBLICATIONS

International Search Report dated Mar. 26, 2020, issued in counterpart Application No. PCT/JP2019/122978. (15 pages).
(Continued)

*Primary Examiner* — Sherman Ng
(74) *Attorney, Agent, or Firm* — WHDA, LLP

(57) ABSTRACT

The disclosure relates to a display panel. The display panel may have a display area, a transition area, and a via hole area. The transition area may be between the via hole area and the display area. The display panel may include a substrate; an isolation structure on the substrate only in the transition area; and an encapsulation layer in both of the transition area and the display area. A first side surface of the isolation structure facing the via hole area may include a recess toward an interior of the isolation structure, and the encapsulation layer may include a cavity surrounding the isolation structure in the recess.

20 Claims, 4 Drawing Sheets

(58) Field of Classification Search
USPC .......................................................... 174/255
See application file for complete search history.

(56) References Cited

U.S. PATENT DOCUMENTS

| | | | |
|---|---|---|---|
| 2010/0289997 A1* | 11/2010 | Suzuki | .............. H01L 29/41733 |
| | | | 349/158 |
| 2017/0062489 A1* | 3/2017 | Chen | .................... H01L 27/1248 |
| 2018/0040643 A1* | 2/2018 | Lu | ........................ G02F 1/1362 |
| 2018/0076228 A1 | 3/2018 | Wang et al. | |
| 2018/0204854 A1* | 7/2018 | Zhang | ................ H01L 21/32139 |
| 2019/0143631 A1* | 5/2019 | Zhang | ..................... B32B 3/266 |
| | | | 428/138 |
| 2019/0214586 A1 | 7/2019 | Li | |

FOREIGN PATENT DOCUMENTS

| | | |
|---|---|---|
| CN | 108231855 A | 6/2018 |
| CN | 108666277 A | 10/2018 |
| CN | 108666347 A | 10/2018 |
| CN | 109103346 A | 12/2018 |
| CN | 109671864 A | 4/2019 |
| CN | 109801956 A | 5/2019 |
| CN | 110277510 A | 9/2019 |

OTHER PUBLICATIONS

Office Action dated Mar. 20, 2020, issued in counterpart CN Application No. 201910570439.0, with English Translation. (19 pages).

\* cited by examiner

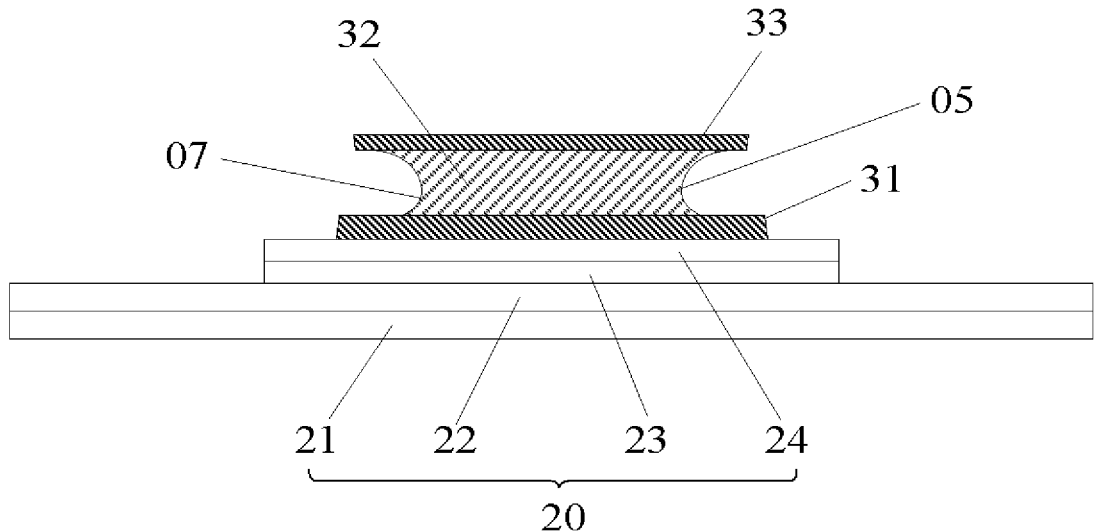

FIG. 5

| providing a substrate; the display panel including a display area, a transition area, and a via hole area, the transition area being between the via hole area and the display area | 601 |

↓

| forming an isolation structure on the substrate; a first side surface of the isolation structure facing the via hole area comprising a recess toward an interior of the isolation structure | 602 |

↓

| forming an encapsulation layer; the encapsulation layer covering the isolation structure and the display area; wherein the encapsulation layer comprises a cavity at a portion adjacent to the first side surface of the isolation structure | 603 |

FIG. 6

DISPLAY PANEL, MANUFACTURING METHOD THEREOF, AND DISPLAY APPARATUS

CROSS-REFERENCE TO RELATED APPLICATIONS

This application claims benefit of the filing date of Chinese Patent Application No. 201910570439.0 filed on Jun. 27, 2019, the disclosure of which is hereby incorporated in its entirety by reference.

TECHNICAL FIELD

The present disclosure relates to the field of display technologies, and in particular, to a display panel, a manufacturing method thereof, and a display apparatus.

BACKGROUND

At present, in order to achieve a higher screen ratio of the display panel, a via hole may be provided in the display area of the display panel, and an apparatus such as a camera may be disposed in the via hole.

In general, when a display panel is prepared, a via hole area in which a display film is not formed may be reserved in a conventional display area. However, when the display panel is packaged using an Open Mask, since the thickness of the via hole area is smaller than the thickness of the display area and the Open Mask cannot achieve floating occlusion, the via hole area also forms an encapsulation film layer with a normal thickness. Thus, when the via hole is formed in the via hole area, since the encapsulation film layer is thick, cracks are extremely likely to occur, and the cracks may easily extend to the display area, which in turn causes damage of the display apparatus in the display area.

BRIEF SUMMARY

An embodiment of the present disclosure provides a display panel. The display panel may have a display area, a transition area, and a via hole area. The transition area may be between the via hole area and the display area. The display panel may include a substrate; an isolation structure on the substrate only in the transition area; and an encapsulation layer in both of the transition area and the display area. A first side surface of the isolation structure facing the via hole area may include a recess toward an interior of the isolation structure, and the encapsulation layer may include a cavity surrounding the isolation structure in the recess.

Optionally, the isolation structure comprises a first metal layer, a second metal layer, and a third metal layer stacked in a direction away from the substrate, wherein a width of the second metal layer is smaller than a width of the first metal layer and a width of the third metal layer in a direction parallel to the substrate.

Optionally, the width of the first metal layer is larger than the width of the third metal layer in the direction parallel to the substrate.

Optionally, a thickness of the third metal layer is smaller than a thickness of the first metal layer in a direction perpendicular to the substrate.

Optionally, materials of the first metal layer and the third metal layer are the same, and a material of the second metal layer is different from the materials of the first metal layer and the third metal layer.

Optionally, the materials of the first metal layer and the third metal layer comprise titanium, and the material of the second metal layer comprises aluminum.

Optionally, the cavity has a closure toward a target direction; the target direction is between a first direction and a second direction, the first direction is a direction away from the substrate, and the second direction is a direction from the display area to the via hole area.

Optionally, the display panel further comprises a composite buffer layer on the substrate; and the isolation structure is on a side of the composite buffer layer opposite from the substrate.

Optionally, the composite buffer layer comprises a stepped structure, the stepped structure surrounding, the via hole area; and the isolation structure is located at a top of the stepped structure.

Optionally, the composite buffer layer includes at least one of a barrier layer, a buffer layer, a gate insulating layer, and an interlayer dielectric layer stacked in a direction perpendicular to the substrate, wherein the barrier layer is disposed closest to the substrate.

Optionally, the transition area surrounds the via hole area, the display area surrounds the transition area, and the isolation structure surrounds the via hole area.

Optionally, a thickness of the isolation structure is greater than or equal to about 485 nm and less than or equal to about 805 nm in a direction perpendicular to the substrate.

Optionally, a width of the isolation structure is greater than or equal to about 4 μm and less than or equal to about 8 μm in a direction parallel to the substrate.

Optionally, the display panel according to one embodiment of the present disclosure further comprises a dam at an edge of the display area near the transition area and surrounding the transition area.

One embodiment of the present disclosure is a method for manufacturing a display panel, the display panel having a display area, a transition area, and a via hole area, the transition area being between the via hole area and the display area, wherein the method comprises providing a substrate; forming an isolation structure on the substrate only in the transition area, wherein a first side surface of the isolation structure facing the via hole area comprises a recess toward an interior of the isolation structure; and forming an encapsulation layer in both of the transition area and the display area; wherein the encapsulation layer comprises a cavity surrounding the isolation structure in the recess.

Optionally, forming the isolation structure on the substrate comprises forming a first metal layer on the substrate; the first metal layer surrounding the via hole area; forming a second metal layer on a side of the first metal layer opposite from the substrate; forming a third metal layer on a side of the second metal layer opposite from the substrate; and etching the first metal layer, the second metal layer, and the third metal layer, thereby obtaining the isolation structure; wherein an etching rate of the second metal layer is greater than an etching rate of the first metal layer and an etching rate of the third metal layer.

Optionally, the first metal layer, the second metal layer, and the third metal layer are etched by a same etching solution for a same duration, thereby obtaining the isolation structure.

Optionally, the display area comprises a layer of luminescent material, and after forming the isolation structure on the substrate, the method further comprises forming a layer of luminescent material in the display area and the transition area; and ablating the layer of luminescent material in the transition area.

Optionally, the method according to one embodiment of the present disclosure further comprises forming a via hole in the via hole area.

One embodiment of the present disclosure is a display apparatus comprising the display panel according to one embodiment of the present disclosure.

BRIEF DESCRIPTION OF THE DRAWINGS

FIG. 5 is a schematic structural diagram of a composite buffer layer according to an embodiment of the present disclosure;

FIG. 6 is a flow chart showing steps of a method for fabricating a display panel according to an embodiment of the present disclosure.

DETAILED DESCRIPTION

In order to make the objects, technical solutions and advantages of the present disclosure more clear, some embodiments of the present disclosure will be further described in detail below with reference to the accompanying drawings.

Figure 1:
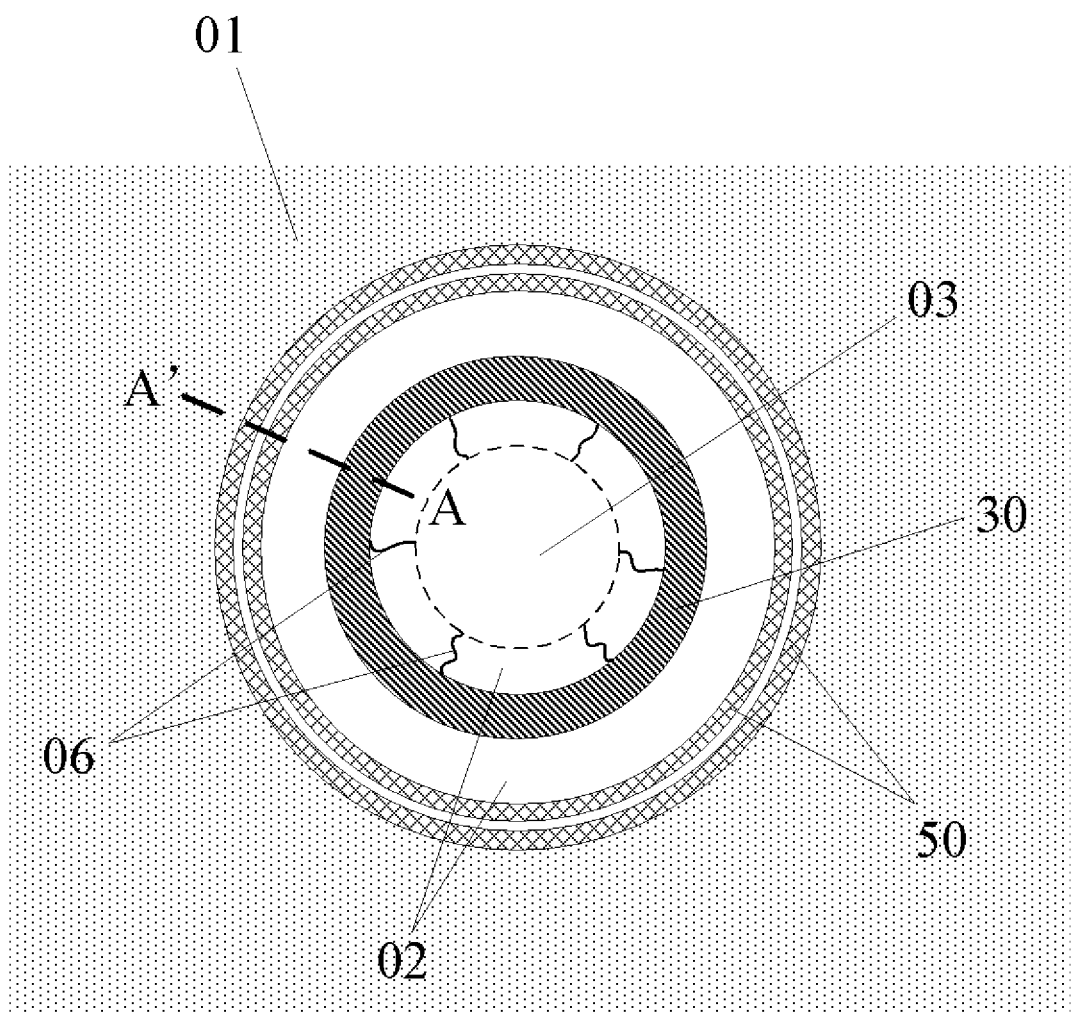
FIG. 1 is a plan view showing a display panel according to an embodiment of the present disclosure.
Figure 2:
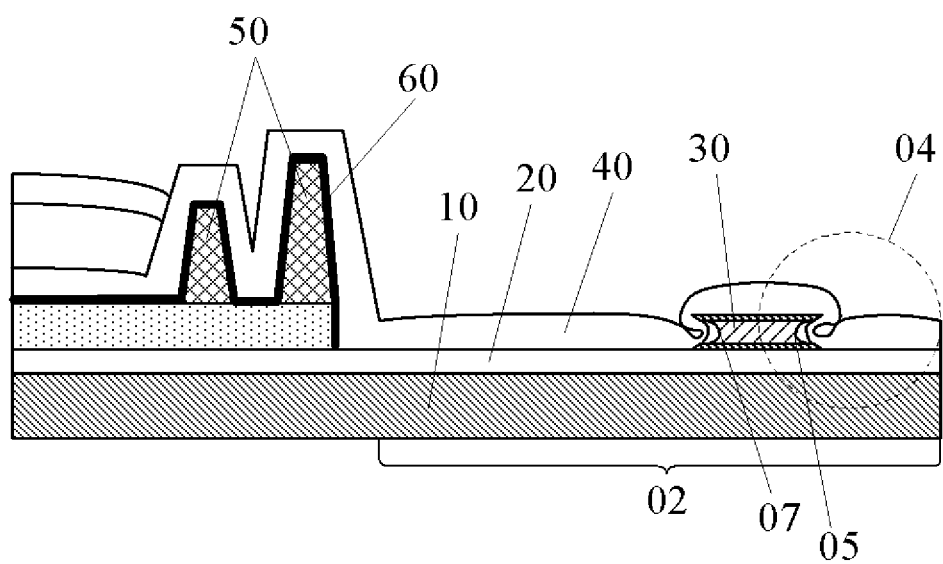
FIG. 2 is a schematic structural view of a display panel at a cross section AA' according to an embodiment of the present disclosure.

FIG. 1 is a top plan view of a display panel according to an embodiment of the present disclosure. Referring to FIG. 1, the display panel includes a display area 01, a transition area 02, and a via hole area 03, and the transition area 02 is disposed between the via hole area 03 and the display area 01. The section AA' can be selected in FIG. 1, so that the structural diagram of the display panel shown in FIG. 2 at the AA' section can be obtained. Referring to FIG. 2, the transition area 02 includes a substrate 10, an isolation structure 30, and an encapsulation layer 40.

Figure 3:
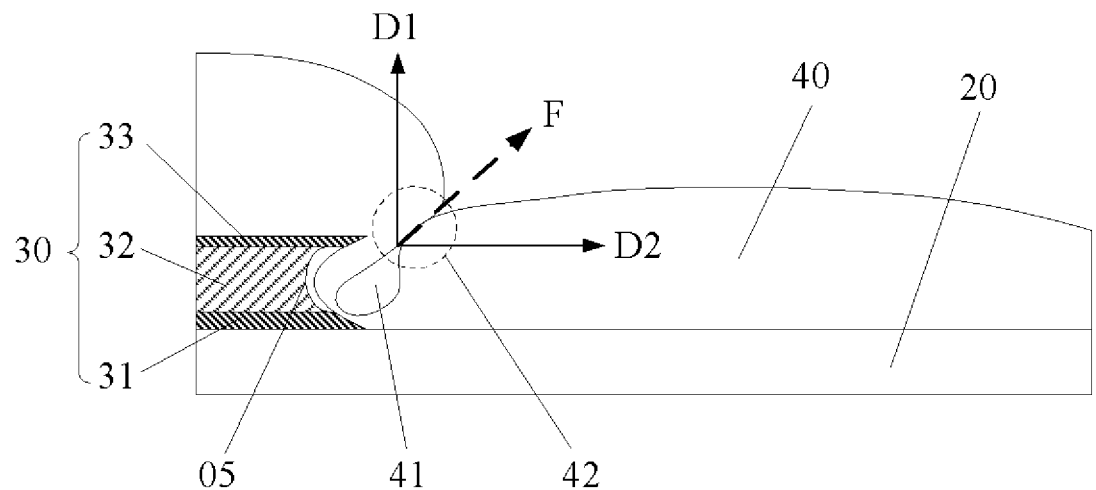
FIG. 3 is a partial enlarged view of a display panel according to an embodiment of the present disclosure.

As shown in FIG. 2, the substrate 10 is the part of the substrate of the display panel corresponding to the portion of the transition area 02. The isolation structure 30 is formed on the substrate, and the first side surface 05 of the isolation structure 30 facing or adjacent to the via hole area 03 has a recess toward the interior of the isolation structure 30. The encapsulation layer 40 encloses the isolation structure 30 and covers the display area 01 to perform water and oxygen isolation from the display area 01, the isolation structure 30, and the like. As shown in FIG. 3, the encapsulation layer 40 has a cavity 41 in a portion adjacent to the first side surface 05 of the isolation structure 30.

In one embodiment of the present disclosure, since the first side surface 05 of the isolation structure 30 adjacent to the via hole area 03 has a recess toward the interior of the isolation structure 30, therefore, the portion of the encapsulation layer 40 adjacent to the first side surface 05 of the isolation structure 30 can be bent along the first side surface 05 of the recess to form the cavity 41 when the film is formed. As such, when the via hole is formed by cutting in the via hole area, the generated crack 06 extends towards the cavity 41 at the first side surface 05 of the isolation structure 30 the stress generated when the via hole is cut can be released through the cavity 41, thereby preventing the crack 06 from continuing to extend to the display area 01. Thus, the display apparatus in the display area can be prevented from being damaged, and the yield of the display panel is improved.

Optionally, referring to FIG. 2, the display panel further includes a composite buffer layer 20 formed on the substrate 10. Correspondingly, the isolation structure 30 is formed on a side of the composite buffer layer 20 away from the substrate 10. Optionally, referring to FIG. 1, the transition area 02 surrounds the via hole area 03, and the display area 01 surrounds the transition area 02. Since the isolation structure 30 is located in the transition area 02, the isolation structure 30 surrounds the via hole area 03. Optionally, the isolation structure 30 can be annular such that the annular isolation structure 30 can enclose the via hole area 03 in the middle. In addition, the dotted circular frame area 04 in FIG. 2 can be enlarged, so that a partial enlarged view of the display panel shown in FIG. 3 can be obtained. Referring to FIG. 3, the isolation structure 30 is recessed toward the interior of the isolation structure 30 at the first side surface 05 of the isolation structure 30 adjacent to the via hole area 03. In addition, referring to FIG. 3, the encapsulation layer 40 is curved to form a cavity 41 near a portion of the first side surface 05 of the isolation structure 30, wherein the cavity 41 has a closure portion 42 toward the target direction F. The target direction F is located between the first direction D1 and the second direction D2. The first direction D1 is a direction away from the substrate 10, that is, a direction from the substrate 10 to the composite buffer layer 20 in the thickness direction of the display panel. The second direction D2 is a direction in which the display area 10 points to the via hole area 30.

Since the isolation structure 30 is recessed toward the interior of the isolation structure 30 near the first side surface 05 of the via hole area 03, therefore, the portion of the encapsulation layer 40 adjacent to the first side surface 05 of the isolation structure 30 can be bent along the first side surface 05 of the recess to form the cavity 41 when the film is formed. Also, the portion of the encapsulation layer 40 covering the top of the isolation structure 30 and the portion of the encapsulation layer 40 covering the composite buffer layer 20 may be closed in the target direction F when the film is formed, so that the cavity 41 is closed toward the target direction F. As such, when the via hole is formed by cutting in the via hole area, the generated crack 06 continues to extend toward the cavity 41 at the first side surface 05 of the isolation structure 30, and is easily extended toward the closure portion 42 of the cavity 41 along the target direction F rather than continuing to extend toward the display area. Therefore, the encapsulation layer 40 corresponding to the closure portion 42 of the cavity 41 can release the stress generated when the via hole is cut, and the crack 06 can be prevented from continuing to extend to the display area. That is, the extension range of the crack 06 can be limited to be inside the range surrounded by the isolation structure 30. In this way, damage of the display apparatus in the display area can be avoided, and the yield of the display panel is improved.

Optionally, as shown in FIG. 3, the isolation structure 30 may include a first metal layer 31, a second metal layer 32, and a third metal layer 33 stacked in a direction away from the substrate 10. Wherein, in a direction parallel to the substrate 10, the width of the second metal layer 32 may be smaller than the width of the first metal layer 31 and that of the third metal layer 33. The second metal layer 32 having a smaller width is sandwiched between the first metal layer 31 and the third metal layer 33 having a larger width, so that the first side surface of the isolation structure recessed toward the interior of the isolation structure can be formed. As shown in FIG. 2, in the practical application, the second side surface 07 of the isolation structure 30 facing the display area 01 may also be recessed toward the interior of the isolation structure 30, thereby further enhancing the isolation effect. Embodiments of the present disclosure do not specifically limit whether the second side surface 07 is recessed toward the interior of the isolation structure 30.

Optionally, the width of the first metal layer 31 may be greater than the width of the third metal layer 33 in the direction parallel to the substrate 10, that is, the first metal layer 31 closer to the composite buffer layer 20 may be set wider, while the third metal layer 33 away from the composite buffer layer 20 may be set narrower, so that the structural stability of the isolation structure 30 can be enhanced.

In a specific application, the materials of the first metal layer 31 and the third metal layer 33 may be the same, and the material of the second metal layer 32 may be different from the materials of the first metal layer 31 and the third metal layer 33. Wherein, the etching rate corresponding to the second metal layer 32 may be greater than the etching rates corresponding to the first metal layer 31 and the third metal layer 33. Therefore, when the isolation structure 30 having the recessed side is formed by the etching process, the first metal layer 31, the second metal layer 32, and the third metal layer 33 can be simultaneously etched for the same duration by the same etching liquid. The width of the second metal layer 32 can be made smaller than the widths of the first metal layer 31 and the third metal layer 33, so that the isolation structure 30 in which the first side surface 05 and the second side surface 07 are both recessed toward the interior can be formed.

Further, optionally, in the direction vertical to substrate 10, the thickness of the third metal layer 33 may be smaller than the thickness of the first metal layer 31, so that the etching speed can be increased, and the isolation structure 30 having the concave side can be obtained more quickly.

Optionally, the material of the first metal layer 31 and the third metal layer 33 may be titanium metal, and the material of the second metal layer 32 may be aluminum metal, which are not specifically limited in the embodiments of the present disclosure.

Further, in practical applications, the thickness of the isolation structure 30 may be greater than or equal to about 485 nanometers and less than or equal to about 805 nanometers in a direction perpendicular to the substrate 10. That is, the total thickness of the first metal layer 31, the second metal layer 32, and the third metal layer 33 may be greater than or equal to about 485 nanometers and less than or equal to about 805 nanometers. Wherein, in a specific application, since the cavity 41 requires a certain space, the thickness of the second metal layer 32 may be set to be thicker than that of the first metal layer 31 and the third metal layer 33, as shown in FIG. 3.

Optionally, the thickness of the first metal layer 31 may be greater than or equal to about 250 angstroms and less than or equal to about 750 angstroms, the thickness of the second metal layer 32 may be greater than or equal to about 4400 angstroms and less than or equal to about 6600 angstroms, and the thickness of the third metal layer 33 may be greater than or equal to about 200 angstroms and less than or equal to about 700 angstroms.

Optionally, in practical applications, the width of the isolation structure 30 may be greater than or equal to about 4 microns and less than or equal to about 8 microns in the direction parallel to substrate 10. Wherein, the width of the isolation structure 30 may specifically refer to the maximum width of the isolation structure 30 in the direction parallel to the substrate 10.

Figure 4:
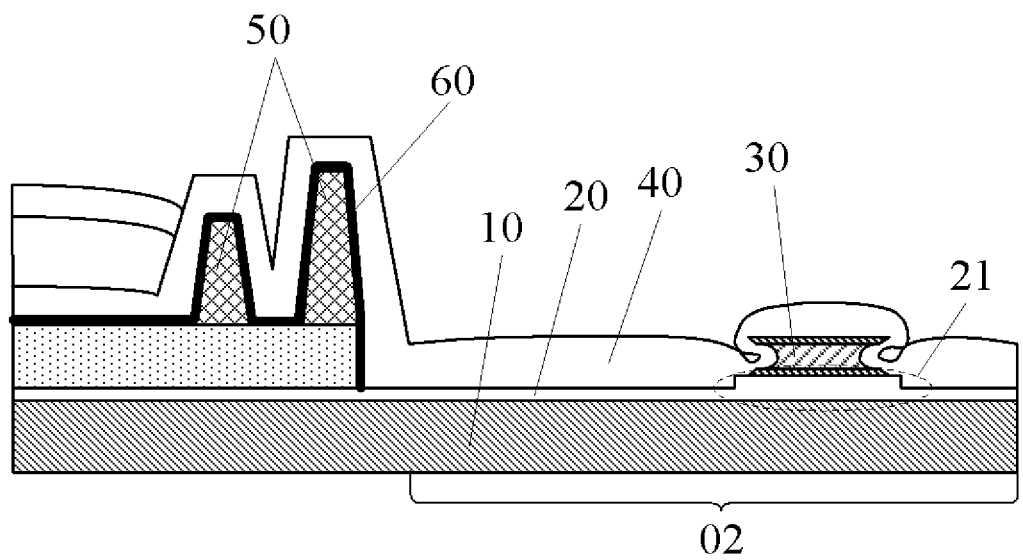
FIG. 4 is a schematic structural view at a cross section of AA' of a display panel according to an embodiment of the present disclosure.

Further, FIG. 4 shows a schematic structural view of a display panel along the AA' section. The composite buffer layer 20 may have a stepped structure 21 that surrounds the via hole area 03, and the isolation structure 30 may be located at the top of the step structure 21. Since the step structure 21 tends to concentrate stress substantially toward the apex portion of the target direction F, therefore, when the via hole is formed by cutting in the via hole area, and when the generated crack 06 extends toward the step structure 21 of the composite buffer layer 20, at least a portion of the stress generated when the via hole is cut will be released at the top corner portion of the step structure 21, thereby preventing the crack 06 from continuing to extend to the display area. In this way, the display apparatus in the display area can be further prevented from being damaged, and the yield of the display panel is improved.

Optionally, in practical applications, the composite buffer layer 20 may include at least one of the barrier layer 21, the buffer layer 22, the gate insulating layer 23, and the interlayer dielectric layer 24 stacked in the thickness direction of the display panel. Among them, the barrier layer 21 is disposed closest to the substrate 10. For example, the composite buffer layer 20 may include the barrier layer 21, the buffer layer 22, the gate insulating layer 23, and the interlayer dielectric layer 24, or include the barrier layer 21, the buffer layer 22, and the gate insulating layer 23, or only include the barrier layer 21 and the buffer layer 22, which this embodiment of the present disclosure does not specifically limit.

In an optional implementation manner, FIG. 5 shows a specific structural diagram of a composite buffer layer 20. As shown in FIG. 5, the composite buffer layer 20 may include a barrier layer 21, a buffer layer 22, a gate-insulating layer 23, and an interlayer dielectric layer 24 which are stacked in the thickness direction of the display panel. Wherein, the buffer layer 22 may cover the barrier layer 21, the gate insulating layer 23 may partially cover the buffer layer 22, and the interlayer dielectric layer 24 may cover the gate insulating layer 23. Thus, the gate insulating layer 23 and the interlayer dielectric layer 24 may constitute the stepped structure 21 of the composite buffer layer 20 to release at least a portion of the stress generated when the via hole holes are formed by cutting. Of course, in practical applications, the interlayer dielectric layer 24 may constitute the step structure 21, or the buffer layer 22, the gate insulating layer 23, and the interlayer dielectric layer 24 may constitute the step structure 21, which this embodiment of the present disclosure does not specifically limit.

Further, referring to FIG. 2 or FIG. 4, the display panel may further include at least one dam 50, and the dam 50 may be located at an edge of the display area 01 near the transition area 02 and surround the transition area 02. If the stress generated when the via hole is formed by cutting is too large, the crack 06 continues to extend toward the display area 01 through the isolation structure 30. Then, in this case, the dam 50 can further release stress to block the crack 06, thereby preventing the crack 06 from extending to the display area 01. Referring to FIG. 2 or FIG. 4, a luminescent material layer 60 of the display panel may cover the dam 50.

In one embodiment of the present disclosure, the transition area disposed between the display area and the via hole area in the display panel may include a substrate, an isolation structure formed on the substrate, and an encapsulation layer covering the isolation structure and the display area. Wherein the first side surface of the isolation structure facing or adjacent to the via hole area has a recess toward the interior of the isolation structure, and the encapsulation layer has a cavity at a portion adjacent to the first side surface of the isolation structure. In one embodiment of the present disclosure, since the first side surface of the isolation structure facing or adjacent to the via hole area has a recess toward the interior of the isolation structure, therefore, the portion of the encapsulation layer adjacent to the first side surface of the isolation structure can be bent along the first side surface of the recess to form the cavity when the film is formed. As such, when the via hole is formed by cutting in the via hole area, the generated crack extends to the cavity near the first side surface 05 of the isolation structure, the stress generated when the via hole is formed by cutting can be released through the cavity, and the crack is prevented from continuing to extend to the display area. Thus, the display apparatus in the display area can be prevented from being damaged, and the yield of the display panel is improved.

FIG. 6 is a flow chart showing steps of a method for manufacturing a display panel according to one embodiment of the present disclosure. Referring to FIG. 6, the method may specifically include the following steps:

Step 601 includes providing a substrate; the display panel includes a display area, a transition area, and a via hole area, the transition area is disposed between the via hole area and the display area; and the substrate is a part of a substrate of the display panel corresponding to the transition area.

In one embodiment of the present disclosure, the material of the substrate may be a flexible material such as PI (polyimide), which is not specifically limited in the embodiment of the present disclosure.

In practical applications, the transition area may surround the via hole area, and the display area may surround the transition area.

Step 602 includes forming an isolation structure on the substrate; the first side surface of the isolation structure facing or adjacent to the via hole area has a recess toward the interior of the isolation structure.

Optionally, in this step, a composite buffer layer may be first formed on the substrate, and then an isolation structure may be formed on the composite buffer layer.

Optionally, the step of forming a composite buffer layer on the substrate may include: first forming a buffer layer substrate on the substrate, and then forming a stepped structure on a side of the buffer layer substrate away from the substrate to obtain a composite buffer layer, and the step structure surrounds the via hole area.

Optionally, the buffer layer substrate may include at least one of a barrier layer, a buffer layer, a gate insulating layer, and an interlayer dielectric layer which are stacked in a thickness direction of the display panel, wherein the barrier layer is disposed adjacent to the substrate. Taking the buffer layer substrate including a barrier layer, a buffer layer, a gate insulating layer, and an interlayer dielectric layer as an example, first, a barrier layer, a buffer layer, a gate insulating layer, and an interlayer dielectric layer may be sequentially formed on the substrate by a deposition process such as deposition or evaporation. It should be noted that, in practical applications, the above film layer in the transition area may be formed in a same layer as the film layer of the same material in the display area. Therefore, for the transition area, the above four film layers are formed in this order, and for the display area, other film layers may be formed among the above four film layers. Then, the step structure can be etched on the side of the buffer layer substrate away from the substrate by an etching process, such as a thy etching process. Specifically, at least one of the buffer layer, the gate insulating layer, and the interlayer dielectric layer may be etched to obtain a step structure.

In an embodiment of the present disclosure, the isolation structure may include a first metal layer, a second metal layer, and a third metal layer stacked in a direction away from the substrate. Correspondingly, the step of forming the isolation structure can be specifically implemented by: forming a first metal layer on the substrate; the first metal layer surrounding the via hole area; forming a second metal layer on a side of the first metal layer away from the substrate; forming a third metal layer on a side of the second metal layer away from the substrate; etching the first metal layer, the second metal layer and the third metal layer to obtain an isolation structure; wherein the etching rate of the second metal layer is greater than the etching rate of the first metal layer and that of the third metal layer.

Optionally, since the composite buffer layer can be formed on the substrate, the first metal layer can be formed on the side of the composite buffer layer away from the substrate. Since the etching rate corresponding to the second metal layer is greater than the etching rate corresponding to the first metal layer and that of the third metal layer, therefore, the first metal layer, the second metal layer, and the third metal layer may be etched by using an etching solution having a faster etching rate of the second metal layer. Thereby, the side surface of the second metal layer can be formed into a shape recessed toward the interior of the isolation structure. Optionally, in a specific application, the material of the first metal layer and the third metal layer may be titanium metal, and the material of the second metal layer may be aluminum metal.

Optionally, since the composite buffer layer may include a step structure, the step of forming the isolation structure on the side of the composite buffer layer away from the substrate may specifically include: forming an isolation structure on top of the step structure of the composite buffer layer. That is, the first metal layer, the second metal layer, and the third metal layer may be sequentially formed on the top of the step structure of the composite buffer layer, and then the first metal layer, the second metal layer, and the third metal layer are further etched to obtain an isolation structure.

In practical applications, since the Open Mask is also required when forming the luminescent material layer of the display panel, the Open Mask cannot achieve floating occlusion when forming the luminescent material layer. Therefore, when the luminescent material layer is formed after the isolation structure is formed, a luminescent material layer of a normal thickness is formed also in the transition area where display is not required. After a lot of reliability tests, it was found that if the transition area includes the luminescent material layer, the reliability of the display panel is poor, and the display panel is easily broken. This is because the water and oxygen easily enters the display area along the luminescent material layer exposed at the cutting edge, so that the display panel package will fail.

In a practical application, the display area may further include a luminescent material layer, and correspondingly, after step 602 and before step 603, the method may further include the following steps: forming a luminescent material layer; and ablate the luminescent material layer in the transition area. That is, after the luminescent material layer is evaporated in the transition area by the Open Mask, the luminescent material layer in the transition area can be ablated by a laser apparatus before the encapsulation layer is formed, thereby removing the luminescent material portion in the transition area. It has been proved by a large number of reliability tests that the reliability of the display panel can be improved, and the water and oxygen may be prevented from entering the display area along the luminescent material layer exposed at the cutting edge, thereby improving the packaging reliability of the display panel.

Step 603 includes forming an encapsulation layer to obtain a display panel; the encapsulation layer covers the isolation structure and the display area; and the encapsulation layer has a cavity at a portion near the first side surface of the isolation structure.

After the luminescent material layer in the transition area is removed by a laser ablation process, the encapsulation layer may be formed by a process such as CVD (Chemical Vapor Deposition). Wherein, the encapsulation layer covers the isolation structure and the composite buffer layer of the display area and the transition area. After the completion of the preparation of each of the film layers in the display area and the transition area, the via hole may be cut in the via hole area along the cutting line at the edge of the reserved via hole area, so that the display panel can be obtained.

Since the isolation structure is recessed toward the interior near the first side of the isolation structure adjacent to the via hole area, therefore, the portion of the encapsulation layer adjacent to the first side surface of the isolation structure can be bent along the first side surface of the recess to form the cavity when the film is formed. Also, a portion of the encapsulation layer covering the top of the isolation structure and a portion of the encapsulation layer covering the composite but layer may be closed along the target direction F when the film is formed, so that the cavity is closed toward the target direction F. As such, when the via hole is cut in the via hole area, the generated crack continues to extend toward the cavity near the first side surface of the isolation structure, and is easily extended along the closure portion of the cavity toward the target direction F rather than continuing to extend toward the display area. Therefore, the encapsulation layer corresponding to the closure portion of the cavity can release the stress generated when the via hole is formed by cutting, and the crack can be prevented from continuing to extend to the display area. That is, the extension range of the crack can be limited to be inside the range surrounded by the isolation structure. In this way, damage of the display apparatus in the display area can be avoided, and the yield of the display panel is improved.

In one embodiment of the present disclosure, a substrate may be first provided, the substrate corresponding to a transition area between the display area and the via hole area, and then an isolation structure may be formed on the substrate. Wherein, the first side surface of the isolation structure adjacent to the via hole area has a recess toward the interior of the isolation structure, and thus an encapsulation layer may be formed to obtain a display panel. Wherein, the encapsulation layer encapsulates the isolation structure and covers the display area, and the encapsulation layer has a cavity at a portion close to the first side surface of the isolation structure. In one embodiment of the present disclosure, since the first side surface of the isolation structure adjacent to the via hole area has a recess toward the interior of the isolation structure, therefore, the portion of the encapsulation layer adjacent to the first side surface of the isolation structure can be bent along the first side surface of the recess to form the cavity when the film is formed. As such, when the via hole is cut in the via hole area, the generated crack extends to the cavity near the first side surface of the isolation structure, the stress generated when the via hole is cut can be released through the cavity, and the crack is prevented from continuing, to extend to the display area. Thus, the display apparatus in the display area can be prevented from being damaged, and the yield of the display panel is improved.

One embodiment of the present disclosure further discloses a display apparatus comprising the above display panel according to one embodiment of the present disclosure.

In one embodiment of the present disclosure, the transition area disposed between the display area and the via hole area in the display panel may include a substrate, an isolation structure formed on the substrate, and an encapsulation layer covering the isolation structure and the display area. Wherein the first side surface of the isolation structure adjacent to the via hole area has a recess toward the interior of the isolation structure, and the encapsulation layer has a cavity at a portion adjacent to the first side surface of the isolation structure. In one embodiment of the present disclosure, since the first side surface of the isolation structure adjacent to the via hole area has a recess toward the interior of the isolation structure, therefore, the portion of the encapsulation layer adjacent to the first side surface of the isolation structure can be bent along the first side sur ace of the recess to form the cavity when the film is formed. As such, when the via hole is cut in the via hole area, the generated crack extends toward the cavity near the first side surface 05 of the isolation structure, the stress generated when the via hole is cut can be released through the cavity, and the crack is prevented from continuing to extend to the display area. Thus, the display apparatus in the display area can be prevented from being damaged, and the yield of the display panel is improved.

For the foregoing method embodiments, for the sake of simple description, they are all expressed as a series of action or combinations. However, it should be understood by those skilled in the art that the present disclosure is not limited by the described order of the acts, as some steps may be performed in other sequences or concurrently in accordance with the present disclosure. In addition, those skilled in the art should also understand that the embodiments described in the specification are all preferred embodiments, and the actions and modules involved are not necessarily required by the present disclosure.

The various embodiments in the present specification are described in a progressive manner, and each embodiment focuses on differences from other embodiments, and the same similar parts between the various embodiments can be referred to each other.

Finally, it should also be noted that in this context, relational terms such as first and second are used merely to distinguish one entity or operation from another and does not necessarily require or imply any such actual relationship or order between these entities or operations. Moreover, the terms "including" "comprising" and the equivalent are intended to encompass a non-exclusive inclusion, thus, a process, method, article, or apparatus that comprises a series of elements includes not only those elements but also other elements that are not explicitly listed, or elements that are inherent to such a process, method, article, or apparatus. Without more restrictions, an element defined by the phrase "comprising a . . . " does not exclude the presence of additional equivalent elements in the process, method, item, or apparatus including the element. A numeric value modified by "about" means that the numeric value can vary by 10% thereof.

The display panel, the preparation method thereof and the display apparatus provided by the disclosure are described in detail above. The principles and embodiments of the present disclosure have been described with reference to specific examples. The description of the above embodiments is only for helping to understand the method of the present disclosure and its core ideas; At the same time, for those of ordinary skill in the art, in accordance with the idea of the present disclosure, there will be changes in specific embodiments and applications. In summary, the content of the specification should not be construed as limiting the disclosure.

What is claimed is:

1. A display panel, having a display area, a transition area, and a via hole area, the transition area being between the via hole area and the display area, the display panel comprising:
    a substrate;
    an isolation structure on the substrate only in the transition area; and
    an encapsulation layer in both of the transition area and the display area;
    wherein a first side surface of the isolation structure facing the via hole area comprises a recess toward an interior of the isolation structure, and the encapsulation layer comprises a cavity surrounding the isolation structure in the recess.

2. The display panel according to claim 1, wherein the isolation structure comprises a first metal layer, a second metal layer, and a third metal layer stacked in a direction away from the substrate,
    wherein a width of the second metal layer is smaller than a width of the first metal layer and a width of the third metal layer in a direction parallel to the substrate.

3. The display panel according to claim 2, wherein the width of the first metal layer is larger than the width of the third metal layer in the direction parallel to the substrate.

4. The display panel according to claim 2, wherein a thickness of the third metal layer is smaller than a thickness of the first metal layer in a direction perpendicular to the substrate.

5. The display panel according to claim 2, wherein materials of the first metal layer and the third metal layer are the same, and a material of the second metal layer is different from the materials of the first metal layer and the third metal layer.

6. The display panel according to claim 5, wherein the materials of the first metal layer and the third metal layer comprise titanium, and the material of the second metal layer comprises aluminum.

7. The display panel according to claim 1, wherein the cavity has a closure toward a target direction; the target direction is between a first direction and a second direction, the first direction is a direction away from the substrate, and the second direction is a direction from the display area to the via hole area.

8. The display panel according to claim 1, wherein the display panel further comprises a composite buffer layer on the substrate; and the isolation structure is on a side of the composite buffer layer opposite from the substrate.

9. The display panel according to claim 8, wherein the composite buffer layer comprises a stepped structure, the stepped structure surrounding the via hole area; and the isolation structure is located at a top of the stepped structure.

10. The display panel according to claim 8, wherein the composite buffer layer includes at least one of a barrier layer, a buffer layer, a gate insulating layer, and an interlayer dielectric layer stacked in a direction perpendicular to the substrate, wherein the barrier layer is disposed closest to the substrate.

11. The display panel according to claim 1, wherein the transition area surrounds the via hole area, the display area surrounds the transition area, and the isolation structure surrounds the via hole area.

12. The display panel according to claim 1, wherein a thickness of the isolation structure is greater than or equal to about 485 um and less than or equal to about 805 nm a direction perpendicular to the substrate.

13. The display panel according to claim 1, wherein a width of the isolation structure is greater than or equal to about 4 μm and less than or equal to about 8 μm in a direction parallel to the substrate.

14. The display panel according to claim 1, further comprising a dam at an edge of the display area near the transition area and surrounding the transition area.

15. A display apparatus comprising the display panel according to claim 1.

16. A method for manufacturing a display panel, the display panel having a display area, a transition area, and a via hole area, the transition area being between the via hole area and the display area, wherein the method comprising:
    providing a substrate;
    Conning an isolation structure on the substrate only in the transition area, wherein a first side surface of the isolation structure facing the via hole area comprises a recess toward an interior of the isolation structure; and
    forming an encapsulation layer in both of the transition area and the display area; wherein the encapsulation layer comprises a cavity surrounding the isolation structure in the recess.

17. The method of claim 16, wherein forming the isolation structure on the substrate comprises:
    forming a first metal layer on the substrate: the first metal layer surrounding the via hole area;
    forming a second metal layer on a side of the first metal layer opposite from the substrate;
    forming a third metal layer on a side of the second metal layer opposite from the substrate; and
    etching the first metal layer, the second metal layer, and the third metal layer, thereby obtaining the isolation structure;
    wherein an etching rate of the second metal layer is greater than an etching rate of the first metal layer and an etching rate of the third metal layer.

18. The method according to claim 17, wherein the first metal layer, the second metal layer, and the third metal layer are etched by a same etching solution for a same duration, thereby obtaining the isolation structure.

19. The method according to claim 16, wherein the display area comprises a layer of luminescent material, and after forming the isolation structure on the substrate, the method further comprising:
    forming a layer of luminescent material in the display area and the transition area; and
    ablating the layer of luminescent material in the transition area.

20. The method according to claim 16, further comprising forming a via hole in the via hole area.

* * * * *